(12) United States Patent
LeRoy

(10) Patent No.: US 6,219,108 B1
(45) Date of Patent: Apr. 17, 2001

(54) RADIO RECEIVER DETECTING DIGITAL AND ANALOG TELEVISION RADIO-FREQUENCY SIGNALS WITH SINGLE FIRST DETECTOR

(75) Inventor: Allen LeRoy, Fairfax County, VA (US)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/003,513

(22) Filed: Jan. 6, 1998

Related U.S. Application Data

(63) Continuation-in-part of application No. 08/825,711, filed on Mar. 19, 1997, now Pat. No. 5,982,457.
(60) Provisional application No. 60/034,610, filed on Jan. 7, 1997.

(51) Int. Cl.$^7$ .............................. H04N 5/44; H04N 5/455
(52) U.S. Cl. .......................... 348/724; 348/725; 348/554; 348/555; 348/558
(58) Field of Search .................................. 348/725, 726, 348/727, 426, 723, 500, 555, 554, 720, 729, 558, 721, 724; 455/3.2; H04N 5/44, 5/455

(56) References Cited

U.S. PATENT DOCUMENTS

| | | | |
|---|---|---|---|
| 5,122,879 | * | 6/1992 | Ito .......................................... 348/607 |
| 5,132,797 | * | 7/1992 | Citta ....................................... 348/607 |
| 5,134,707 | * | 7/1992 | Sakashita et al. ..................... 455/3.2 |
| 5,450,392 | * | 9/1995 | Waltrich ................................ 348/21 |
| 5,512,957 | * | 4/1996 | Hulyalkar ............................. 348/607 |
| 5,546,132 | * | 8/1996 | Kim et al. ............................. 348/607 |
| 5,592,235 | * | 1/1997 | Park et al. ............................. 348/555 |
| 5,715,012 | * | 2/1998 | Patel et al. ............................ 348/555 |
| 5,801,790 | * | 9/1998 | Limberg ................................ 348/607 |
| 5,805,241 | * | 9/1998 | Limberg ................................ 348/725 |
| 5,818,543 | * | 10/1998 | Lee ....................................... 348/725 |
| 5,982,457 | * | 11/1999 | Limberg ................................ 348/725 |
| 5,986,716 | * | 11/1999 | Sokawa et al. ....................... 348/553 |
| 6,057,876 | * | 5/2000 | Waight ................................. 348/725 |

* cited by examiner

Primary Examiner—Reinhard Eisenzopf
Assistant Examiner—Linus M. Lo
(74) Attorney, Agent, or Firm—Sughrue, Mion, Zinn, Macpeak & Seas, PLLC

(57) ABSTRACT

Radio receivers for receiving DTV signals, in accordance with the Advanced Television Systems Committee (ATSC) standard, or analog TV, in accordance with the National Television Sub-Committee (NTSC) standard, each use a single first detector for both types of signal. This single first detector supplies its output signals to an intermediate-frequency amplifier chain for DTV signals and to another intermediate-frequency amplifier chain for analog TV signals. The response of the intermediate-frequency amplifier chain for DTV signals is synchrodyned to baseband and supplied to symbol decoding circuitry. The response of the intermediate-frequency amplifier chain for analog TV signals is supplied to a video detector. In some of the radio receivers the sound carrier of the NTSC signal has a separate, further intermediate-frequency amplifier chain. The intermediate-frequency chain for DTV signals comprises an intitial portion which has reverse AGC, a following mixer, and a final portion which also has reverse AGC. The intermediate-frequency chain for analog TV luma signals comprises an intitial portion which has forward AGC, a following mixer, and a final portion which has AGC.

26 Claims, 7 Drawing Sheets

RADIO RECEIVER DETECTING DIGITAL AND ANALOG TELEVISION RADIO-FREQUENCY SIGNALS WITH SINGLE FIRST DETECTOR

This is a complete application filed under 35 U.S.C. 111(a) claiming, pursuant to 35 U.S.C. 119(e)(1), benefit of the filing date of provisional application Ser. No. 60/034,610 filed Jan. 7, 1997, pursuant to 35 U.S.C. 111(b), which complete application is a continuation-in-part of U.S. patent application Ser. No. 08/825,711 filed Mar. 19, 1997, now Pat. No. 5,982,457, also claiming benefit of the filing date of provisional application Ser. No. 60/034,610 filed Jan. 7, 1997.

The present invention relates to the radio receiver portions of television (TV) signal receivers for receiving terrestrial through-the-air television broadcasting in the United States of America whether the received signals be digital television signals, in accordance with the Advanced Television Systems Committee (ATSC) standard, or analog television signals, in accordance with the National Television Sub-Committee (NTSC) standard.

BACKGROUND OF THE INVENTION

The first detector in a television signal receiver converts radio-frequency (RF) signals in a selected one of the television broadcast channels, which channels occupy various 6-MHz-wide portions of the electromagnetic wave frequency spectrum, to an intermediate-frequency (IF) signals in one particular 6-MHz-wide portion of that spectrum. This conversion is typically carried out by superheterodyning the RF signals, which is to say mixing the RF signals with local oscillations from an oscillator oscillating at a frequency substantially higher than the frequencies in the television channel of highest frequency. The first detector is used to convert a selected RF signal to IF signal in order that up to 60 dB or more amplification can be done in that particular 6-MHz-wide portion of that spectrum using intermediate-frequency amplifiers with fixed, rather than variable, tuning. Amplification of the received signals is necessary to raise them to power levels required for further signal detection operations, such as video detection and sound detection in the case of analog TV signals, and such as symbol decoding in the case of digital TV signals. The first detector usually includes variable tuning elements in the form of pre-selection filter circuitry for the RF signals to select among the various 6-MHz-wide television channels and in the further form of elements for determining the frequency of the local oscillations used for super-heterodyning the RF signals. In TV receivers of more recent design the local oscillator signals are often generated using a frequency synthesizer in which the local oscillator signals are generated with frequency regulated in adjustable ratio with the fixed frequency of a standard oscillator.

Television signal receivers for receiving digital television (DTV) signals that have been described in the prior art use plural-conversion radio receivers wherein DTV signal in a selected one of the ultra-high-frequency (UHF) channels is first up-converted in frequency to first intermediate-frequency signal in a first intermediate-frequency band centered at 920 MHz for amplification in a first intermediate-frequency amplifier. The resulting amplified first intermediate-frequency signal is then down-converted in frequency by mixing it with 876 MHz local oscillations, resulting in a second intermediate-frequency signal. This second intermediate-frequency signal, in a second intermediate-frequency band centered at 44 MHz, is then amplified in a second intermediate-frequency amplifier. The response of the second intermediate-frequency amplifier is then synchrodyned to baseband in DTV signal receivers developed by the Grand Alliance.

Radio receivers for receiving DTV signals, in which receivers the final intermediate-frequency signal is somewhere in the 1–8 MHz frequency range, are described by C. B. Patel and the inventor in U.S. Pat. No. 5,479,449 issued Dec. 26, 1995, entitled "DIGITAL VSB DETECTOR WITH BANDPASS PHASE TRACKER, AS FOR INCLUSION IN AN HDTV RECEIVER", and included herein by reference. The radio receivers specifically described in U.S. Pat. No. 5,479,449 are of triple-conversion type using a 920 MHz analog IF amplifier for first detector response, the first detector being an up-converter, and using a 44 MHz analog IF amplifier for second detector response, the second detector being a down-converter. A third detector is a further down-converter, generating a 1–8 MHz final IF signal as third detector response. This final IF signal is not amplified, but is digitized by an analog-to-digital converter for use in digital circuitry for synchrodyning to baseband. The resulting digital baseband signal is equalized and then data-sliced in a symbol decoder. The first intermediate-frequency amplifier in one of the DTV signal receivers described in U.S. Pat. No. 5,479,449 uses a surface-acoustic wave (SAW) filter for establishing the bandwidth of the 920 MHz IF amplifier.

The DTV signal receiver developed by the Grand Alliance is of double-conversion type using a 920 MHz analog IF amplifier for first detector response, the first detector being an up-converter, and using a 44 MHz analog IF amplifier for second detector response, the second detector being a down-converter. The amplified response of the 44 MHz analog IF amplifier is the final IF signal, which is synchrodyned to baseband in the analog regime. The resulting analog baseband response is then digitized by an analog-to-digital converter prior to being equalized and then data-sliced in a symbol decoder. The first intermediate-frequency amplifier in The DTV signal receiver developed by the Grand Alliance uses ceramic resonators for establishing the bandwidth of the 920 MHz IF amplifiers.

For a period of years while DTV broadcasting is becoming established, it is planned that the broadcasting of analog TV signals will continue in the United States in accordance with the NTSC standard using the same UHF channels as DTV signals as well as other channels in the VHF and UHF bands. While analog and digital TV signals occupy the same television channels, the requirements of radio receivers for the two types of TV signal are not particularly compatible. Accordingly, there are good reasons for using separate radio receivers for analog TV signals and for digital TV signals in a system designed to receive both types of TV signal.

A reason for using separate radio receivers for analog TV signals and for digital TV signals that will be quite apparent to an electronics design engineer reviewing the systems standards for the two types of TV signals concerns the different radio receiver passbands for each type of TV signal. In an analog TV signal the video carrier is located at a frequency 1.25 MHz above the lower limit frequency of the TV channel, and the vestigial sideband exhibits no gain reduction vis-a-vis the full sideband until modulating frequencies exceed 750 kHz. Accordingly, the radio receiver for an analog TV signal customarily exhibits a linear roll-off of the overall intermediate-frequency response supplied to the video detector, which roll-off is down 6 dB at the video carrier frequency and provides for an overall flat baseband video response up to 4.2 MHz or so. In a DTV signal, the data is located at a frequency only 310 kHz above the lower limit frequency of the TV channel; and roll-off down 6 dB at the data carrier frequency is provided at the transmitter, rather than at the receiver. The overall intermediate-frequency response is essentially flat over a frequency band 6 MHz-wide between 1-dB-down limit frequencies in Grand Alliance receiver designs published by Zenith Radio Corporation.

A radio receiver for an analog TV signal customarily uses a trap filter for removing frequency-modulated sound carrier from the IF signal supplied the video detector. This is necessary to suppress a 920 kHz beat between the FM sound carrier and the amplitude-modulated chrominance subcarrier, which beat causes unwanted variation in the luminance component of the composite video signal recovered by the video detector. This luminance variation is obtrusively apparent when viewing images reproduced on a television viewscreen. Sound trap filters have not been used in prior-art DTV receiver designs, though co-channel interfering NTSC signals are a known problem during HDTV reception. The avoidance of trap filtering in the IF amplifiers of a DTV signal receiver makes it easier to maintain phase linearity throughout the IF passband.

A more subtle reason for using separate radio receivers for analog TV signals and for digital TV signals, of which one of ordinary skill in the art of design of just one of these types of radio receiver is probably unaware, is the difference in preferred designs of automatic gain control (AGC) for the radio receiver portions of analog TV signal receivers and of DTV signal receivers.

The power in an analog TV signal must be quite high in order that accompanying Johnson or galactic noise is low enough in amplitude as not to cause "is now" (luminance noise) in a black-and-white TV picture or "colored snow" (luminance plus chrominance noise) in a color TV picture. The effective radiated power from an analog TV transmitter is typically tens of kilowatts. The IF amplifiers in an analog TV signal receiver typically provide maximum gain of 60 to 90 dB, which can be reduced responsive to automatic gain control (AGC). Gain reduction of as much as 66 dB is required to handle the gamut of usable signal strengths. When receiving analog TV signals, this gain reduction is preferably obtained using forward AGC in at least the earlier IF amplifier stages. This avoids the problem of internally generated noise in the IF amplifier stages rising vis-a-vis Johnson noise to adversely affect overall noise figure for the radio receiver, which problem is encountered when using reverse AGC. The great concern with loss in noise figure when receiving analog TV signals arises because the human eye is quite sensitive to the presence of random noise accompanying the composite video signal from the video detector. The amplitude of the luminance signal component of the composite video signal directly controls the intensity of light emanating from or reflected from the television display device, and the amplitudes of the chrominance signal component of the composite video signal directly affect the hue and color saturation of that light.

In a DTV receiver the radio receiver portion thereof supplies plural-level symbol codes as baseband output signal, and the light emanating from or reflected from the television display device is not directly controlled by the amplitude of such baseband output signal. Small amounts of random noise are strongly rejected by quantizing effects in the data-slicing and trellis decoding associated with symbol decoding. Consequently, the overall noise figure for the radio receiver becomes of concern chiefly when distinguishing between the various levels of the symbol codes becomes a problem. In order best to facilitate distinguishing between the various levels of the symbol codes, linearity of the baseband output signal detected by the radio receiver becomes an important concern, and there is less concern for the overall noise figure for the radio receiver unless long-distance reception of DTV signals is sought for transmissions with power levels in the few hundreds of watts.

The AGC of the IF amplifiers in a DTV signal receiver must be such as to avoid non-linearity. Forward AGC tends to introduce non-linearity into the modulation of the IF signal. The resulting distortion is generally tolerable in analog TV signal reception, since larger amplitude modulation properly occurs primarily during synchronizing pulses, and since luminance signal varies in inverse logarithmic relation to scene brightness. Reverse AGC that does not introduce non-linearities into the modulation of the IF signal can be designed for a DTV signal receiver. This can be done using variable-resistance emitter degeneration in a common-emitter transistor amplifier, for example. Or, by way of further example, the collector current of a common-emitter transistor amplifier can be split using common-base transistor amplifiers connected at their emitter electrodes to form a variable-transconductance multiplier. The loss in noise figure with reduction of gain in such reverse AGC arrangements presents little problem as long as overall noise internally generated within the IF amplifier chain of the DTV receiver is smaller than the smallest transitions between digital modulation levels in the final IF amplifier output signal.

The inventor points out that the cost of a first detector is substantial enough that it is undesirable to use separate first detectors for analog TV signals and for digital TV signals in radio receivers designed to receive both types of signal, whether those radio receivers are included in a TV set complete with viewscreen or in a digital recording apparatus, such as one using magnetic tape as a recording medium. The use of a single first detector for both analog TV signals and digital TV signals is also desirable in that it allows more compact radio receiver design and at the same time avoids any problems of unwanted radiation from the output of one of separate respective first detectors for analog TV signals and for digital TV signals to the other first detector.

SUMMARY OF THE INVENTION

A radio receiver for receiving DTV signals, in accordance with the Advanced Television Systems Committee (ATSC) standard, or analog TV, in accordance with the National Television Sub-Committee (NTSC) standard, embodies a principal aspect of the invention by using a single first detector for both types of signal, but separate arrangements for amplifying the response of this single first detector to each of these types of signal. The single first detector supplies its output signals to an intermediate-frequency amplifier chain for DTV signals and to another intermediate-frequency amplifier chain for analog TV signals. The response of the intermediate-frequency amplifier chain for DTV signals is synchrodyned to baseband and supplied to symbol decoding circuitry. The response of the intermediate-frequency amplifier chain for analog TV signals is supplied to a video detector. Preferably, the IF amplifier chain for DTV signals employs amplifier stages subject to reverse AGC which maintains linearity of gain despite reduced gain, and the IF amplifier chain for analog TV signals employs amplifier stages at least an earliest of which is subject to forward AGC which maintains good noise figure despite reduced gain.

In another aspect of the invention, embodied in certain radio receivers that also embody the principal aspect of the invention, video carrier or pilot carrier extracted from the intermediate-frequency amplifier chain for DTV signals is used for automatic fine tuning of the single first detector.

In a further aspect of the invention, embodied in certain radio receivers that also embody the principal aspect of the invention, video carrier extracted from the intermediate-frequency amplifier chain for DTV signals is used in the production of intercarrier sound intermediate-frequency signals from response of the intermediate-frequency amplifier chain for analog TV signals.

In a still further aspect of the invention, embodied in radio receivers of plural-conversion type that also embody the principal aspect of the invention, the intermediate-frequency amplifier chain for DTV signals and the intermediate-frequency amplifier chain for analog TV signals contain respective mixers superheterodyning amplified first detector responses with oscillations from a shared local oscillator.

DETAILED DESCRIPTION

Figure 1:
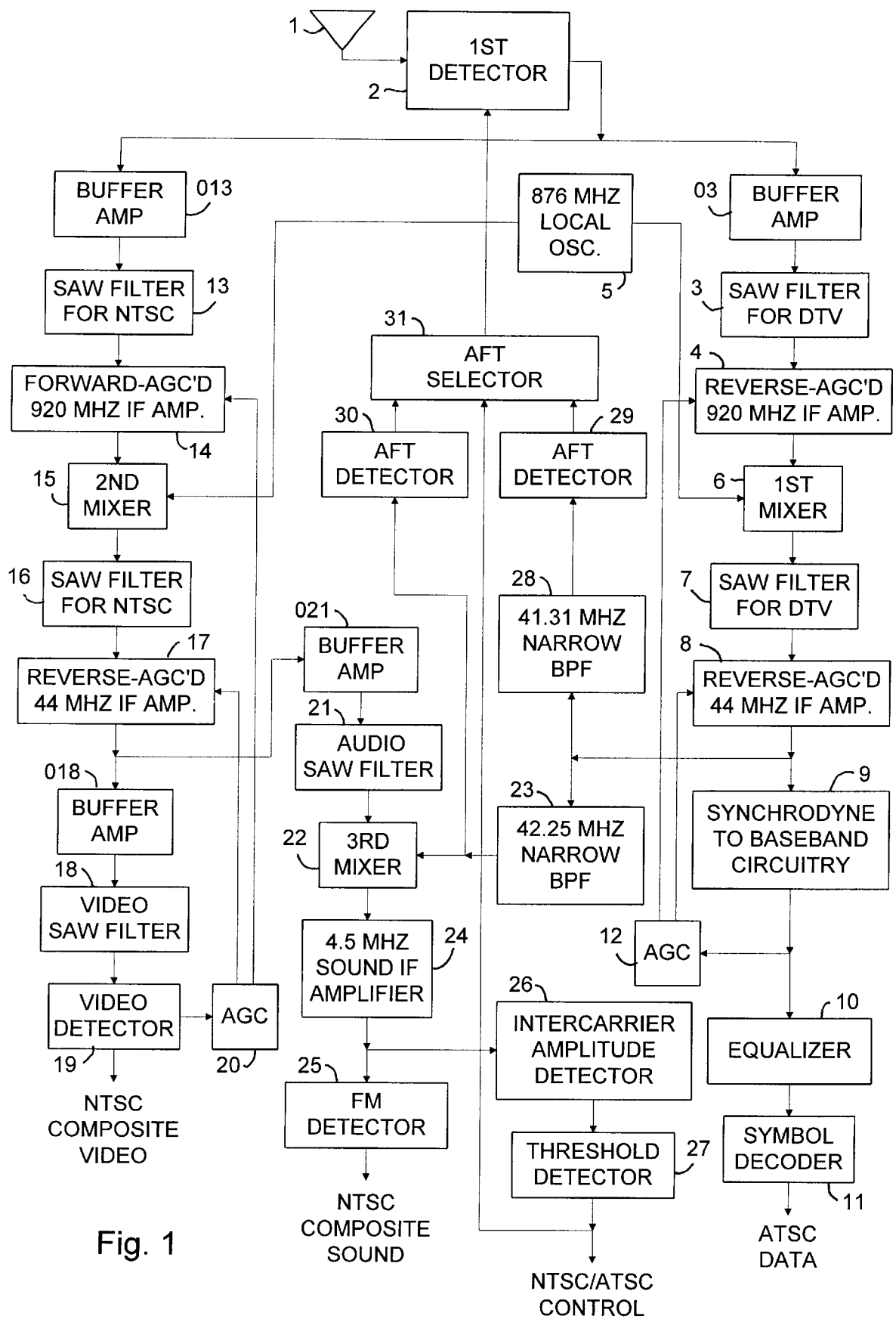
FIG. 1 is a block schematic diagram of portions of a receiver for analog TV and digital TV signals, which portions of a receiver embody the invention.

FIG. 1 shows the radio receiver portions of a television receiver capable of receiving either analog TV signals or digital TV signals. An antenna 1 is a representative source of television signals in the very high frequency (VHF) and ultra high frequency (UHF) bands for application to a first detector 2. The first detector 2 typically comprises a broadband radio-frequency (RF) amplifier provided with a tracking preselection filter, a first local oscillator with automatic fine tuning, a frequency synthesizer for generating superheterodyning signal of a frequency in selected ratio with the frequency of the first local oscillator, an initial mixer for mixing the selected radio-frequency signal with the superheterodyning signal to generate a first intermediate-frequency signal, and a front-end filter for suppressing the image of the first intermediate-frequency signal in the output signal supplied from the initial mixer. The initial mixer is preferably of a doubly-balanced linear-multiplication type. The first intermediate-frequency signal translates the 6-MHz -wide selected radio-frequency signal so as to be nominally centered at 920 MHz, placing the image frequencies well above 1 GHz so they are easily rejected by a front-end filter with fixed tuning. That is, the first detector 2 can be similar to prior-art first detectors in plural-conversion digital high-definition digital television (HDTV) receivers used by the Grand Alliance during field testing of terrestrial over-the-air HDTV broadcasting in accordance with the ATSC standard.

The portion of the FIG. 1 radio receiver specifically for digital TV signals, at the right of the figure, can be similar to those described in U.S. Pat. No. 5,479,449. The first intermediate-frequency signal supplied from the first detector 2 is applied via a buffer amplifier 03 to a surface-acoustic-wave filter 3 having a substantially linear-phase, flat-amplitude response that has −1 dB to −1 dB bandwidth of 6 MHz . The buffer amplifier 03 provides fixed gain to make up the 10–12 dB insertion loss of the SAW filter 3 and drives the SAW filter 3 from a fixed source impedance chosen to avoid unwanted reflections. The response of the SAW filter 3 to this first IF signal is amplified in a wideband intermediate-frequency amplifier 4 that has reverse AGC. The resulting amplified first intermediate-frequency signal from the IF amplifier 4 and local oscillations from a second local oscillator 5 are applied as first and second input signals, respectively, to a first (IF) mixer 6, which is preferably of a doubly-balanced linear-multiplication type. The second local oscillator 5 is preferably of a type supplying local oscillations at 876 MHz frequency, conditioning the mixer 6 to downconvert a 917–923 MHz IF band to a 41–47 MHz IF band, with pilot carrier for DTV signal at 46.69 MHz, video carrier for NTSC signal at 45.75 MHz, and audio carrier for NTSC signal at 41.25 MHz as in prior art DTV receivers. Conversion applying 876 MHz , rather than 964 MHz, local oscillations to the mixer 6 reverses the spectrum of a received NTSC signal as translated to the 41–47 MHz IF band, so the second harmonic of the 41.25 FM sound carrier falls just below the FM broadcast band and does not present an interference problem in a broadcast FM receiver near the television receiver.

The mixer 6 supplies a second intermediate-frequency signal as its output signal. This second IF signal is applied as input signal to a surface-acoustic-wave filter 7 having a substantially linear-phase, flat-amplitude response over a bandwidth in excess of 6 MHz . The mixer 6 is designed so that its output impedance provides optimal source impedance to the SAW filter 7, in order to avoid unwanted reflections. The response of the SAW filter 7 is amplified in a wideband intermediate-frequency amplifier 8 that has reverse AGC. The resulting amplified second intermediate-frequency signal from the IF amplifier 8 is synchrodyned to baseband by synchrodyning circuitry 9, and the resulting in-phase (or real) baseband signal is equalized by equalizer circuitry 10. The resulting equalized in-phase baseband signal is supplied to a symbol decoder 11. The symbol decoder 11 performs data-slicing operations on the equalized baseband signal to recover data supplied to a trellis decoder in portions of the HDTV receiver not shown in FIG. 1. The in-phase baseband signal from the synchrodyning circuitry 9 is supplied to delayed automatic gain-control circuitry 12 that generates the AGC signals controlling the gains of the IF amplifiers 4 and 8.

The automatic gain-control circuitry 12 can take any of a number of known forms. In the early Grand Alliance receivers the AGC circuitry for DTV signals used a matched filter responsive to data segment code groups, and of the response of this matched filter was peak detected to develop a basic AGC signal which was then use to develop delayed AGC for the IF amplifier stages. An AGC that responds to average symbol value can be used, as described by Citta et alii in U.S. Pat. No. 5,565,932 entitled "AGC SYSTEM WITH PILOT USING DIGITAL DATA REFERENCE". The form for AGC circuitry 12 preferred by the inventor is one that detects the direct component of the baseband signal generated by synchrodyning the pilot carrier to baseband during the reception of DTV signals and that during the reception of analog TV signals falls back on envelope detection of the IF amplifier 8 response to develop AGC. This prevents the IF amplifiers 4 and 8 from operating with excessive gain during the reception of analog TV signals, so that video carrier signals can be extracted from the IF amplifier 8 response.

U.S. Pat. No. 5,479,449 describes the synchrodyning circuitry 9 as including circuitry for converting the amplified second IF signal to a final IF signal somewhere in a 1 to 8 MHz band, an analog-to-digital converter for digitizing the final IF signal, and digital circuitry for completing the synchrodyne to baseband in the digital regime. Alternatively, as in the receivers used by the Grand Alliance during HDTV field testing, the synchrodyning circuitry 9 can be operative in the analog regime, with the analog baseband signal being digitized by an analog-to-digital converter for application to the equalizer circuitry 10. The equalizer circuitry 10 is then cascaded with a phase tracker operative at baseband.

The portion of the FIG. 1 radio receiver specifically for analog TV signals, at the left of the figure, includes a surface-acoustic-wave filter 13 having a substantially linear-phase response over a bandwidth in excess of 6 MHz, but exhibiting an amplitude roll-off at higher frequencies that is 6 dB down in gain at 921.75 MHz, the frequency in the first IF signal that the video carrier is translated to by the first detector 2. This roll-off makes it easier to suppress beats between the video carrier and the sound carrier of the adjacent TV channel. The first intermediate-frequency signal supplied from the first detector 2 is applied to the SAW filter 13 via a buffer amplifier 013 which provides fixed gain to make up the 10–12 dB insertion loss of the SAW filter 13 and drives the SAW filter 13 from a fixed source impedance chosen to avoid unwanted reflections. The response of the SAW filter 13 to the first IF signal is amplified in a wideband intermediate-frequency amplifier 14 that has forward AGC. The resulting amplified first intermediate-frequency signal from the IF amplifier 14 and 876 MHz oscillations from a second local oscillator 5 are applied as first and second input signals, respectively, to a second (IF) mixer 15, which is preferably of a doubly-balanced linear-multiplication type. The mixer 15 supplies a third intermediate-frequency signal as its output signal. This third IF signal is applied as input signal to a surface-acoustic-wave filter 16 having a substantially linear-phase, flat-amplitude response over a bandwidth in excess of 6 MHz. The mixer 15 is designed so that its output impedance provides optimal source impedance to the SAW filter 16, in order to avoid unwanted reflections. The response of the SAW filter 16 is amplified in a wideband intermediate-frequency amplifier 17 that has reverse AGC. The resulting amplified third intermediate-frequency signal from the IF amplifier 17 is supplied via a buffer amplifier 018 to a surface-acoustic-wave filter 18 that passes frequencies above 41.5 MHz for application as input signal to a video detector 19, but traps the FM sound carrier below 41.5 MHz to prevent 920 kHz beats with chroma subcarrier in the composite video signal detected by the video detector 19. The buffer amplifier 018 provides fixed gain to make up the 15–17 dB insertion loss of the SAW filter 18 and drives the SAW filter 18 from a fixed source impedance chosen to avoid unwanted reflections.

The composite video signal detected by the video detector 19 is supplied to delayed automatic gain-control circuitry 20 that generates the AGC signals controlling the gains of the IF amplifiers 14 and 17. The video detector 19 can be either a synchronous detector or an envelope detector. Or, the video detector 19 can comprise a synchronous detector for supplying composite video signal to the luminance and chrominance separation circuitry of the receiver and can further comprise an envelope detector for supplying composite video signal to the AGC circuitry 20 and the sync separation circuitry of the receiver. Usually, a synchronous detector detects with a higher degree of linearity than an envelope detector and better suppresses Johnson noise, justifying the higher cost of synchronous detection as long as an appreciable portion of TV broadcasting is done in accordance with NTSC standards.

The amplified third intermediate-frequency signal from the IF amplifier 17 is supplied to a surface-acoustic-wave filter 21 via a buffer amplifier 021 which drives the SAW filter 21 from a fixed source impedance chosen to avoid unwanted reflections. The SAW filter 21 passes frequencies between 46.5 and 47 MHz for application as first input signal to a third (IF) mixer 22, to supply the mixer 22 with FM sound carrier when NTSC analog TV signals are received. The mixer 22 receives, as its second input signal, response from a narrowband bandpass filter 23. The filter 23 supplies 45.75 MHz video carrier in response to the amplified second IF signal output from the IF amplifier 8. When NTSC analog TV signals are being received, the output signal from the mixer 22 is a frequency-modulated 4.5 MHz intercarrier; and, when NTSC analog TV signals are not being received, the output signal from the mixer 22 is noise. The output signal from the mixer 22 is amplified in a high-gain sound IF amplifier 24 designed to limit only when frequency-modulated 4.5 MHz intercarrier is present in that signal. The response of the sound IF amplifier 24 is supplied to a frequency discriminator or frequency-modulation detector 25, which reproduces NTSC composite sound signal. This NTSC composite sound signal is a baseband signal comprising a main channel component that is a left-plus-right signal during stereophonic sound transmissions. During stereophonic sound transmissions the NTSC composite sound signal comprises a stereophonic subcarrier amplitude modulated by a left-minus-right signal. The NTSC composite sound signal may also comprise other subcarriers modulated by subsidiary audio program (SAP) signal(s).

One skilled in the art of analog TV receiver design will understand that the SAW filter 18 can be replaced with other types of sound trap filtering, such as the bridged-T by way of example, which other types of sound trap filtering are considered to be equivalents of the SAW filter 18 insofar as the invention is concerned. One skilled in the art of analog TV receiver design will also understand that the SAW filter 18 can be replaced with other types of sound IF selection filtering, such as a double-tuned transformer by way of example, which other types of sound IF selection filtering are considered to be equivalents of the SAW filter 21 insofar as the invention is concerned. One skilled in the art of analog TV receiver design will also appreciate that variants in which the IF amplifier 17, as well as the IF amplifier 14, have forward AGC are alternative embodiments of the invention. One skilled in the art of analog TV receiver design will also understand that in alternative embodiments of the invention the SAW filter 13 is replaced by wideband coupling of the first detector 4 output port to the IF amplifier 14 input port, with the low-frequency-end roll-off of the third IF signal being introduced by the SAW filter 16. If the SAW filter 3 does not have sound trap filtering therein, in other embodiments of the invention the SAW filter 3 response can be applied to the IF amplifier 14 as its input signal and the SAW filter 13 dispensed with.

The fact that frequency-modulated 4.5 MHz intercarrier signal is present in output signal from the mixer 22 only when NTSC analog TV signals are being received ether intentionally or because of strong co-channel interference during DTV signal reception is exploited in the FIG. 1 circuitry to develop a NTSC/ATSC CONTROL signal. Amplified mixer 22 output signal is supplied from the sound IF amplifier 24 to an intercarrier amplitude detector 26, which detects the average amplitude of the 4.5 MHz intercarrier. The intercarrier amplitude detector 26 can be a simple envelope detector with a time constant of several NTSC scan lines, for example. The baseband response of the amplitude detector 26 is supplied to a threshold detector 27, which generates the NTSC/ATSC CONTROL signal as its output signal. The threshold detector 27 provides an indication of probable NTSC signal reception, if the detected intercarrier signal exceeds a threshold value in amplitude, and otherwise provides an indication of probable DTV signal reception free from appreciable co-channel interference.

In a concurrently filed U.S. patent application entitled "DTV RECEIVER WITH FILTER IN I-F CIRCUITRY TO SUPPRESS FM SOUND CARRIER OF NTSC CO-CHANNEL INTERFERING SIGNAL" the inventor teaches that it is preferable that the SAW filter 3 have a substantially linear-phase, flat-amplitude response that suppresses the frequency-modulated NTSC sound carrier and that accordingly has a −1 dB to −1 dB bandwidth of only 5.7 MHz. A preferred form for the symbol decoder 11 is also described in that patent application, which is incorporated herein by reference. With the skirts of the SAW filter 3 response being so critically located within the frequency spectrum, automatic fine tuning (AFT) of the first local oscillator in the first detector 2 becomes practically a necessity. The 876 MHz local oscillator 5 is crystal stabilized, so that the amplified second IF signal from the second IF amplifier 8 can be used for AFT during the reception of DTV signals. The fact that the responses of the SAW filters 3 and 7 are both amplitude-flat and phase-linear to the edge of the band at which the pilot carrier of the DTV signal and the video carrier of an NTSC analog TV signal are located makes the amplified second IF signal from the second IF amplifier 8 a suitable signal source for the generation of AFT signals no matter whether the TV signal being currently received is a DTV signal or an analog TV signal.

When a DTV signal is received, a narrow bandpass filter 28 selects 46.69 MHz pilot carrier from the amplified second IF signal to an AFT detector 29. The AFT detector 29 is similar in its general construction to those previously used in analog TV signal receivers, typically comprising a limiter amplifier for the bandpass filter response it receives as input signal, a phase shifter for shifting the pilot carrier 90° when it is at prescribed 46.69 MHz frequency, a multiplier for multiplying the differentially phase-shifted pilot carrier signals together, and a lowpass filter for extracting the AFT signal from the resulting product.

When an analog TV signal is received, the narrow bandpass filter 23 selects 45.75 MHz video carrier from the amplified second IF signal to an AFT detector 30. The AFT detector 30 is similar in its general construction to those previously used in analog TV signal receivers, typically comprising a limiter amplifier for the bandpass filter response it receives as input signal, a phase shifter for shifting the pilot carrier 90° when it is at prescribed 45.75 MHz frequency, a multiplier for multiplying the differentially phase-shifted pilot carrier signals together, and a lowpass filter for extracting the AFT signal from the resulting product.

An AFT selector 31 selects the AFT signal from the AFT detector 30 for application to the first local oscillator in the first detector 2 when the NTSC/ATSC control signal supplied from the threshold detector 27 indicates that an analog TV signal is being received. The AFT selector 31 selects the AFT signal from the AFT detector 29 for application to the first local oscillator in the first detector 2 when the NTSC/ATSC control signal does not indicate that an analog TV signal is being received.

Figure 2:
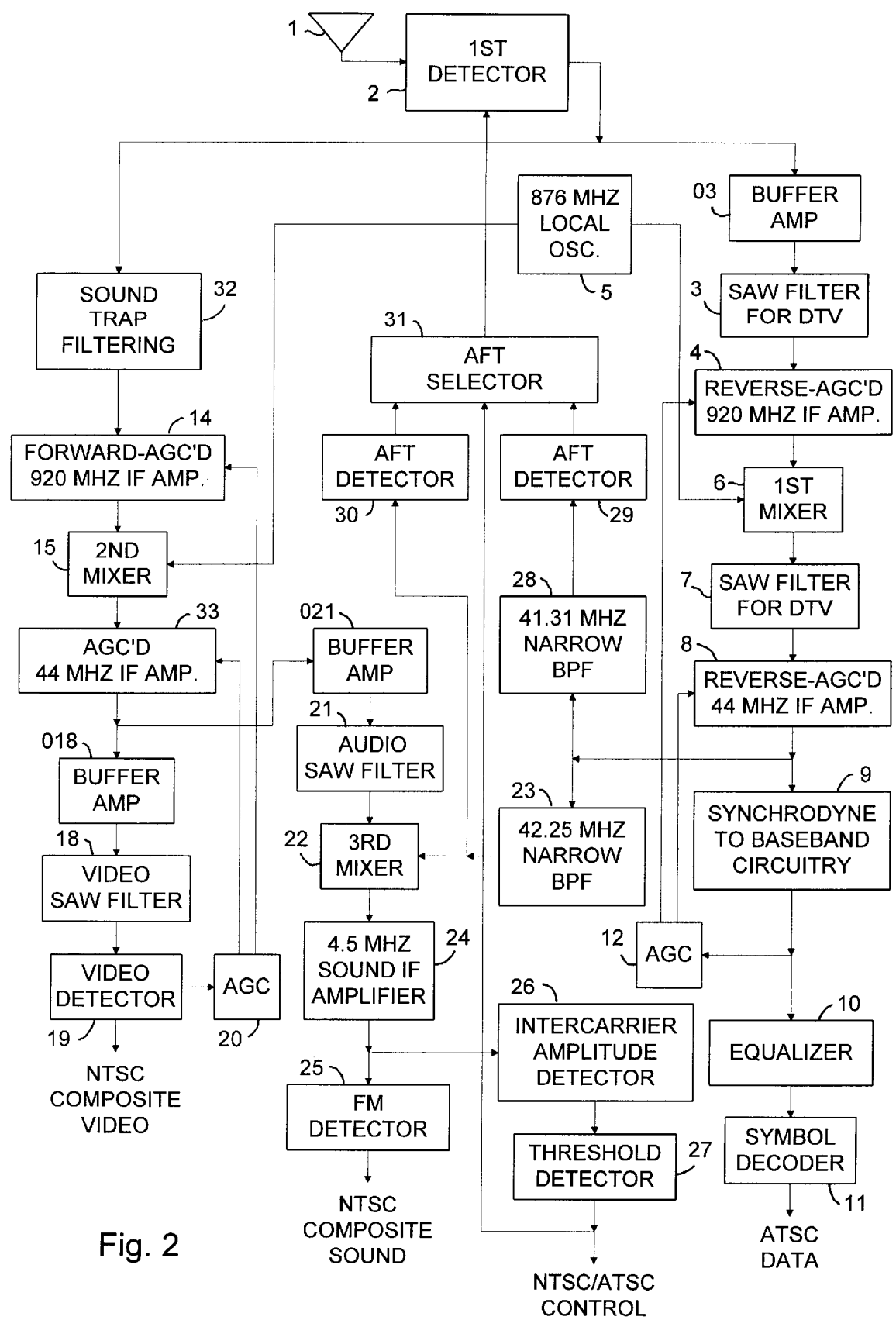
FIG. 2 is a block schematic diagram of portions of another receiver for analog TV and digital TV signals, which portions of a receiver embody the invention.

FIG. 2 shows portions of a radio receiver for receiving analog TV and digital TV signals, which radio receiver portions differ from those in FIG. 1 in the following regards. The SAW filter 13 with −6 dB roll-off in gain at 921.75 MHz is replaced by in-channel and adjacent-channel sound trap filtering 32, as can be constructed using inductors and capacitors. The cascade connection of SAW filter 16 and wideband IF amplifier 17 with reverse AGC is replaced by an IF amplifier 33 with a passband centered at about 44 MHz and with automatic gain control. The amplified response of the IF amplifier 33 supplies input signals to the SAW filters 18 and 21. The video SAW filter 18 with sound carrier rejection, but with flat-amplitude response at the high end of the 44 MHz IF band is replaced by a video SAW filter 34 providing −6 dB roll-off in overall IF gain at 45.75 MHz as well as sound carrier rejection below 41.5 MHz. An example of a SAW filter exhibiting this type of response is the SAF45 MVB80Z manufactured by Murata Manufacturing Co., Ltd., in Erie, Pa.

Figure 3:
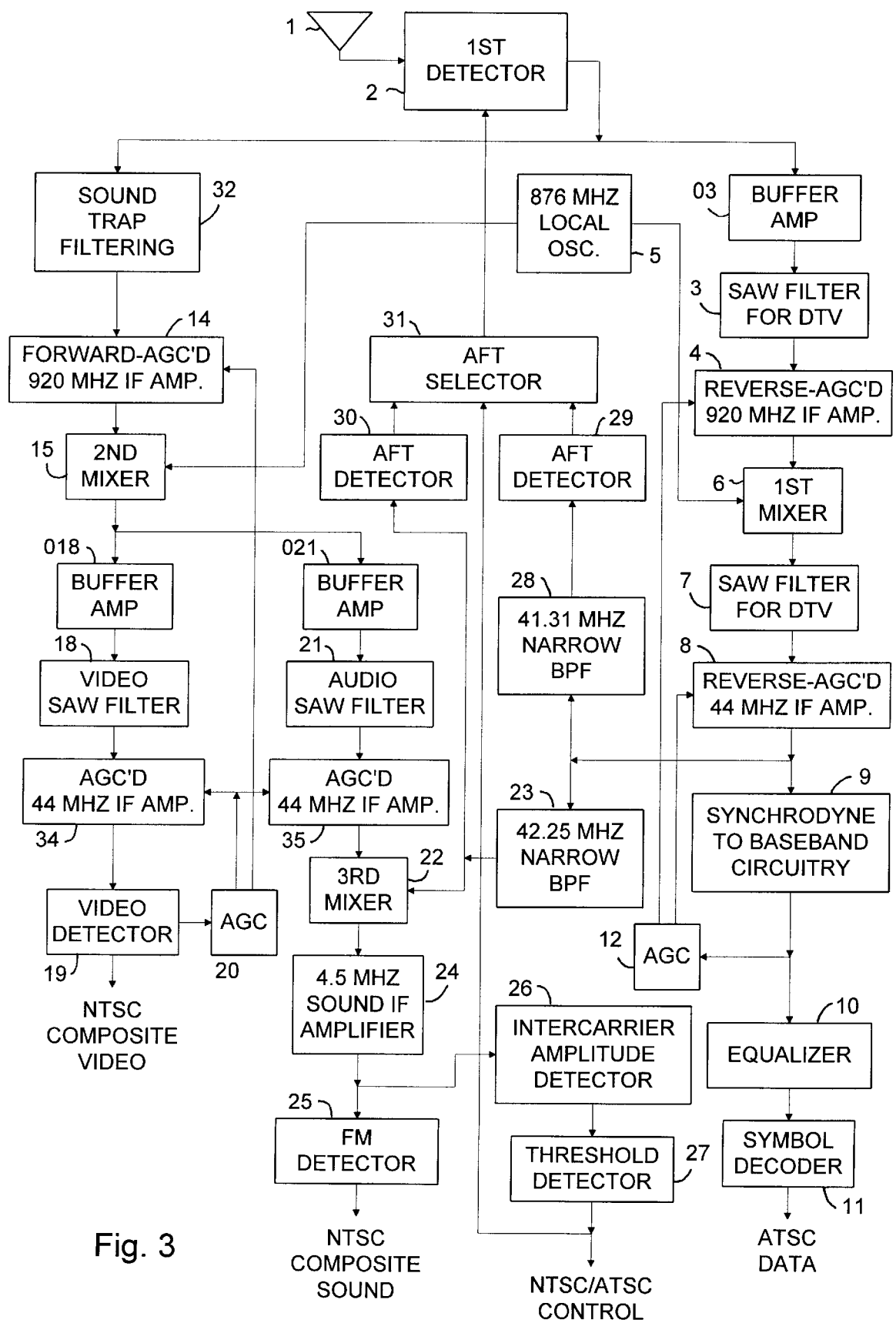
FIG. 3 is a block schematic diagram of portions of still another receiver for analog TV and digital TV signals, which portions of a receiver embody the invention.

FIG. 3 shows modifications of the FIG. 2 portions of a radio receiver, which modifications provide partially parallel IF amplifier chains for the NTSC video carrier modulation and for the NTSC audio carrier modulation. The SAW filters 18 and 22 are supplied input signals directly from the second mixer 15, and the wideband IF amplifier 33 is replaced by two wideband IF amplifiers 34 and 35 similar in their respective construction. The IF amplifier 34 amplifies the response of the SAW filter 18 to NTSC video carrier modulation for application to the video detector 19, and the IF amplifier 35 amplifies the response of the SAW filter 22 to NTSC audio carrier modulation for application to the third mixer 22. The IF amplifiers 34 and 35 are subjected to corresponding automatic gain control signal from the AGC circuitry 20 so that their respective gains track each other.

Figure 4:
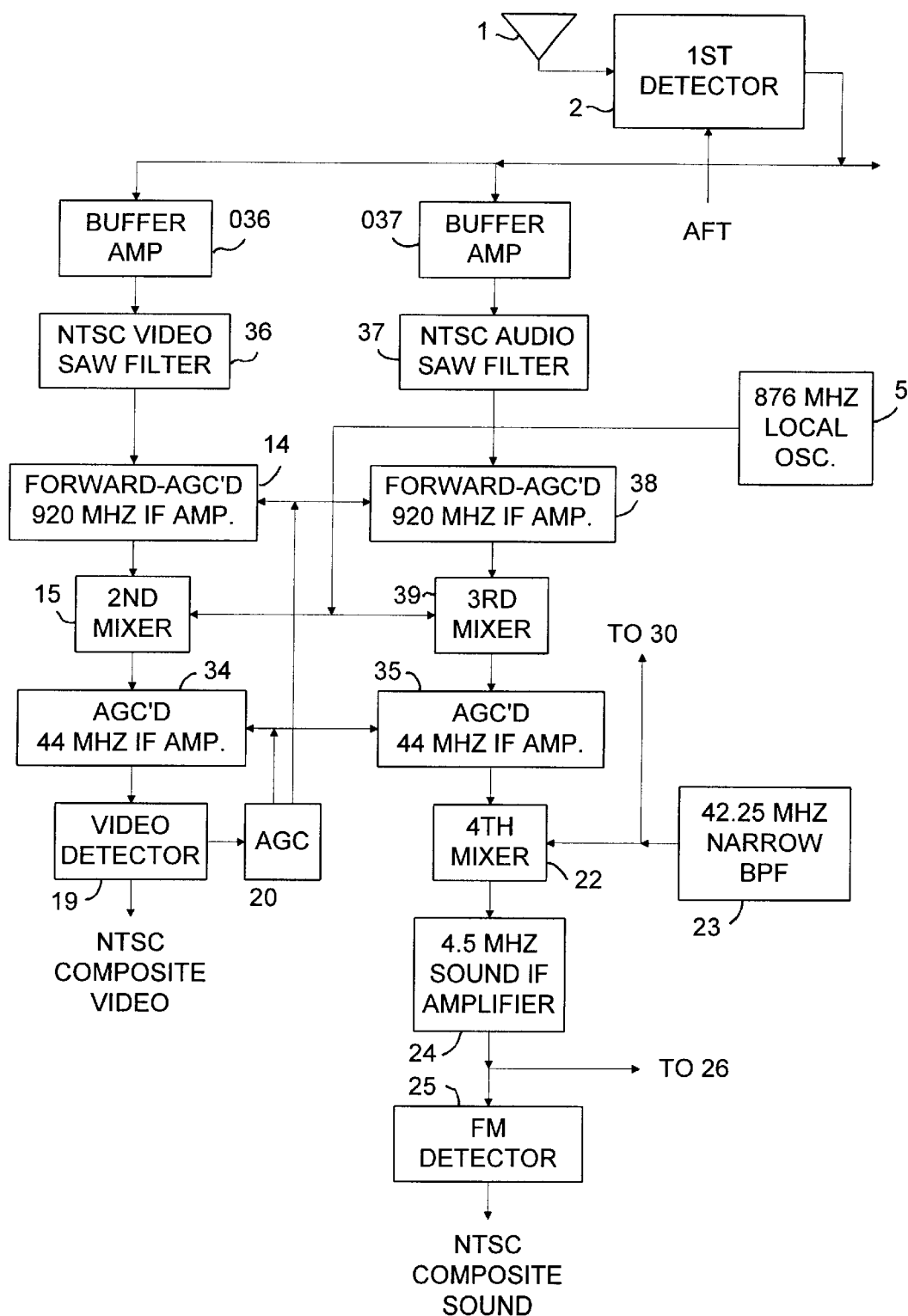
FIG. 4 is a block schematic diagram of modifications made of the FIG. 3 receiver portions in another embodiment of the invention in which there are parallel IF amplifiers for the video and audio portions of NTSC analog TV signal.

FIG. 4 shows modifications of the FIG. 3 portions of a radio receiver, which modifications provide completely parallel IF amplifier chains for the NTSC video carrier modulation and for the NTSC audio carrier modulation. The SAW filters 18 and 22 in the 44 MHz IF band are dispensed with. The −6 dB roll-off of video carrier is introduced by a surface-acoustic-wave filter 36, which replaces the in-channel and adjacent-channel sound trap filtering 32. The first intermediate-frequency signal supplied from the first detector 2 is applied to the SAW filter 36 via a buffer amplifier 036 which provides fixed gain to make up the 10–12 dB insertion loss of the SAW filter 36 and drives the SAW filter 36 from a fixed source impedance chosen to avoid unwanted reflections. The SAW filter 36 differs from the SAW filter 13 of FIG. 1 in having an in-channel sound trap suppressing response for frequencies below 917.5 MHz. The SAW filter 36 has a substantially linear-phase response over a bandwidth of 5.5 MHz, exhibiting an amplitude roll-off at lower frequencies that is 6 dB down in gain at 921.75 MHz, the frequency in the first IF signal that the video carrier is translated to by the first detector 2.

Insofar as the NTSC audio carrier modulation is concerned, a surface-acoustic-wave filter 37 separates the 917–917.5 MHz frequencies in the 917–923 MHz IF band, as may contain FM sound carrier, for application to a wideband IF amplifier 38 similar in its construction to the IF amplifier 14. The first intermediate-frequency signal supplied from the first detector 2 is applied to the SAW filter 37 via a buffer amplifier 037 which provides fixed gain to make up the insertion loss of the SAW filter 37 and drives the SAW filter 37 from a fixed source impedance chosen to avoid unwanted reflections. The IF amplifiers 14 and 38 are subjected to corresponding forward automatic gain control so that their respective gains track each other. A third mixer 39 superheterodynes the amplified response of the IF amplifier 38 with 964 MHz oscillations from the local oscillator 5, to generate third mixer output signals in a 41.0 to 41.5 MHz band that are applied as input signal to the wideband IF amplifier 35. The amplified response of the IF amplifier 35 is supplied to the mixer 22 as its first input signal, the mixer 22 being a fourth mixer in the FIG. 4 circuitry.

Figure 5:
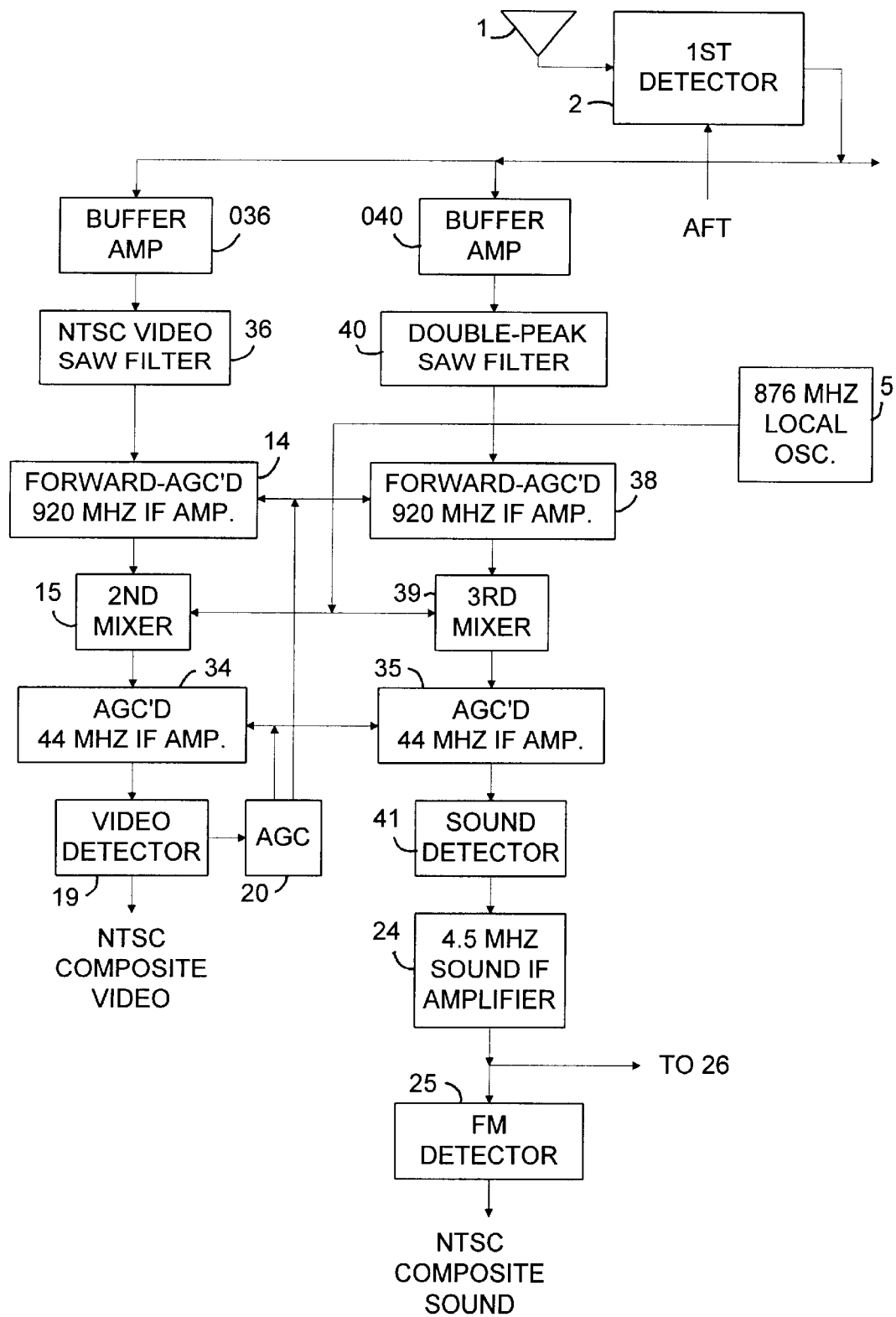
FIG. 5 is a block schematic diagram of modifications made of the FIG. 4 receiver portions in an embodiment of the invention in which the sound component of the NTSC analog TV signal is amplified by 920 MHz and 44 MHz IF amplifiers in the so-called "quasi-parallel" arrangement.

FIG. 5 shows modifications of the FIG. 4 portions of a radio receiver, which modifications in which the sound component of the NTSC analog TV signal is amplified by IF amplifiers in the so-called "quasi-parallel" arrangement. The SAW filter 37 for the 917–917.5 MHz band is replaced by a surface-acoustic-wave filter 40 having a double-hump response peaking at the 917.25 MHz NTSC audio carrier and at the 921.75 MHz NTSC video carrier and at least 10 dB down in response between humps. The first intermediate-frequency signal supplied from the first detector 2 is applied to the SAW filter 40 via a buffer amplifier 040 which provides fixed gain to make up the 10–12 dB insertion loss of the SAW filter 40 and drives the SAW filter 40 from a fixed source impedance chosen to avoid unwanted reflections. The fourth mixer 22 is replaced by a non-linear device operative as a sound detector 41, such as the rectifier in a simple envelope detector, that generates intercarrier input signal for the 4.5 MHz sound IF amplifier 24.

Figure 6:
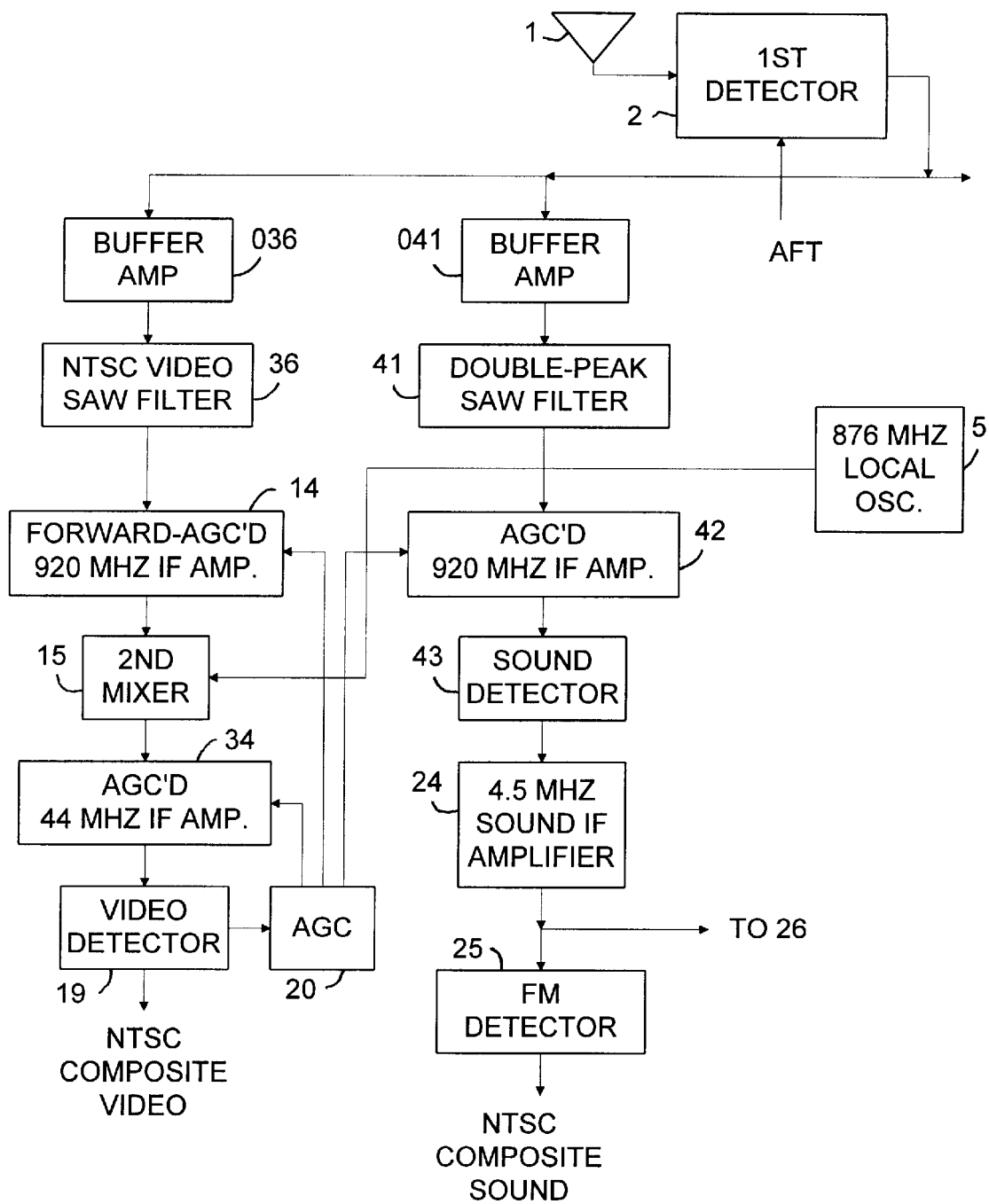
FIG. 6 is a block schematic diagram of modifications made of the FIG. 5 receiver portions in another embodiment of the invention in which the sound component of the NTSC analog TV signal is amplified by just a 920 MHz IF amplifier in the so-called "quasi-parallel" arrangement.

FIG. 6 shows modifications of the FIG. 5 portions of a radio receiver, which modifications in which the response of the SAW filter 40 having a double-hump response is amplified by a wideband IF amplifier 42 with controlled gain. The response of the IF amplifier 42 is supplied to a non-linear device operative as a sound detector 43, such as the rectifier in a simple envelope detector, that generates intercarrier input signal for the 4.5 MHz sound IF amplifier 24.

There is no need to extract video carrier from the IF amplifier 8 response during the reception of analog TV signals when the modifications of FIG. 5 or of FIG. 6 are used, so there is no longer a particular necessity to keep the IF amplifiers 4 and 8 from operating with excessive gain when DTV signals are not being currently received. This permits the AGC circuitry 12 to be simplified, since there is no longer a need to fall back on envelope detection of the IF amplifier 8 response to develop AGC when DTV signals are not being currently received.

Figure 7:
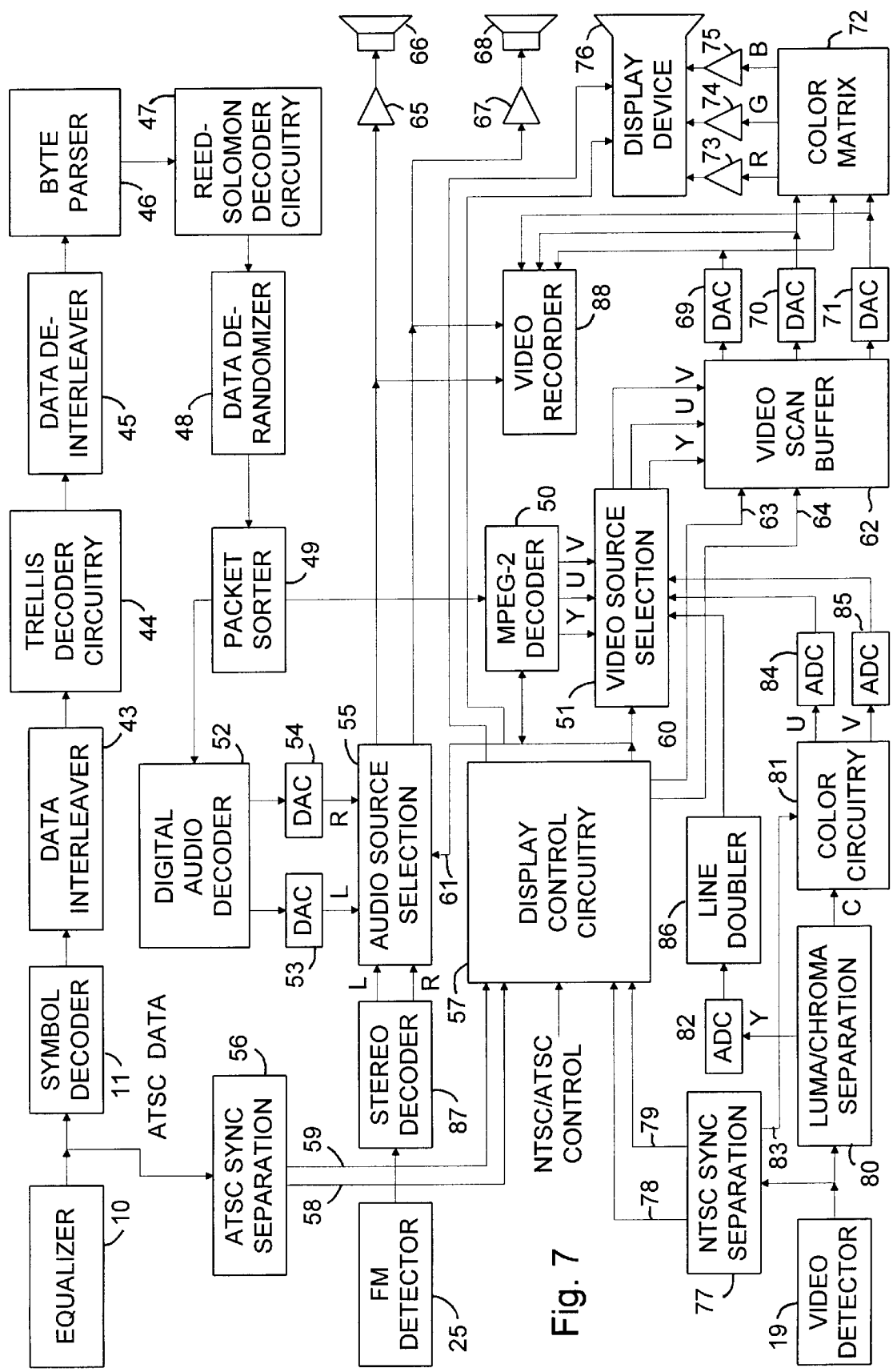
FIG. 7 is a block schematic diagram of the remaining portions of the receiver of any of FIGS. 1, 2, 3, 4, 5 and 6.

FIG. 7 shows the remaining portions of a television set employing radio receiver portions as shown in any of FIGS. 1, 2, 3, 4, 5 and 6. In the DTV portion of the receiver, the data recovered in serial-bit form by the symbol decoder 11 are supplied to a data interleaver 43, which supplies interleaved data in parallel-bit form to trellis decoder circuitry 44. The trellis decoder circuitry 44 supplies output signal in parallel-bit form to a data de-interleaver 45, and the output signal from the data de-interleaver 45 are parsed into bytes by parsing circuitry 46 for application to decoder circuitry 47 for decoding Reed-Solomon forward error-correction coding. The output signal from the Reed-Solomon decoder circuitry 47 is supplied to a data de-randomizer 48 which supplies packets of data to a packet sorter 49. The packet sorter 49 selects packets of video data to an MPEG-2 decoder 50, which supplies a digital luminance (Y) signal and digital chrominance (U and V) signals to video source chooser circuitry 51 in delayed response to those packets of video data. Further, the packet sorter 49 selects packets of audio data to a digital audio decoder 52, which generates digital stereophonic audio signals supplied to digital-to-audio converters (DACs) 53 and 54. The DACs 53 and 54 convert the digital stereophonic audio signals to analog stereophonic audio signals supplied to audio source chooser circuitry 55. The output signal from the equalizer 10 is supplied to ATSC sync separation circuitry 56 for detecting code groups specifying the beginnings of data fields and of data segments in the datastream.

The signals the ATSC sync separation circuitry 56 produces at the beginnings of the data fields are supplied to a controller 57 via a connection 58 and the signals the ATSC sync separation circuitry 56 produces at the beginnings of the data segments are supplied to the controller 57 via a connection 59. The controller 57 supplies a signal applied via a connection 60 to the video source chooser circuitry 51 for controlling its selection of video source and applied via a connection 61 to the audio source chooser circuitry 55 for controlling its selection of audio source. When DTV signal is being received, the controller 57 conditions the video source chooser circuitry 51 to select the digital luminance (Y) signal and digital chrominance (U and V) signals supplied by the MPEG-2 decoder 50 for application to a display buffer memory 62, the writing from which memory 58 is controlled by the controller 57 via a control link 63, and reading into which memory 58 is controlled by the controller 57 via a control link 64. When DTV signal is being received, the controller 57 conditions the audio source chooser circuitry 55 to select the analog stereophonic audio signals supplied by the DACs 53 and 54 for amplification by the audio amplifiers 65 and 66, which supply their respective amplifier responses to a left loudspeaker 67 and a right loudspeaker 68. The controller 57 knows DTV signal is being received when the ATSC sync separation circuitry 56 detects the beginnings of the data fields in a DTV signal. Alternatively, circuitry for detecting the sustained presence of pilot carrier in a DTV signal being currently received can be used to inform the controller 57 of DTV signal reception.

The display buffer memory 62 is read from to supply raster-scanned digital luminance (Y) signal to a digital-to-analog converter 69 and digital chrominance (U and V) signals to digital-to-analog converters 70 and 71. The resulting analog luminance (Y) signal from the digital-to-analog converter 69 and analog chrominance (U and V) signals from the digital-to-analog converters 70 and 71 are supplied to color matrixing circuitry 72 of analog type to generate red, green and blue analog color signals amplified by amplifiers 73, 74 and 75, respectively. The amplified red, green and blue color signals are supplied to a display device 76, the raster scanning of which is controlled by the controller 57. In TV receivers alternative to those diagrammed in FIG. 7, the raster-scanned digital luminance (Y) signal and digital chrominance (U and V) signals read from the display buffer memory 62 can be supplied to color matrixing circuitry of digital type to generate red, green and blue digital color signals that are then converted to red, green and blue analog color signals to be amplified by the amplifiers 73, 74 and 75, respectively.

In the analog TV portion of the receiver, the video detector 19 supplies composite video signal to NTSC sync separation circuitry 77, which supplies horizontal and vertical synchronization signals to the controller 57 via connections 78 and 79, respectively. The video detector 19 also supplies composite video signal to luminance/chrominance separation circuitry 80, which circuitry 80 separates an analog chrominance subcarrier signal for application to color circuitry 81 and separates an analog baseband luminance signal for application to an analog-to-digital converter 82. The color circuitry 81 receives a burst gate signal from the NTSC sync separation circuitry 77 via a connection 83 and responds to its input signals to supply an analog color-difference (U) signal to an analog-to-digital converter 84 and to supply another analog color-difference (V) signal to an analog-to-digital converter 85. The digitized luminance signal is supplied by the ADC 82 to a scan line doubler 86, which converts the 525 scan lines of NTSC luminance to a luminance signal having 1050 scan lines. The scan line doubler 86, the ADC 75 and the ADC 76 supply digitized Y, U and V signals to the video source chooser circuitry 51, for selection to the display buffer memory 62 when the controller 57 determines that an NTSC signal is currently being received and that no DTV signal is currently being received. The FM detector 25 supplies composite audio signal to a stereophonic decoder 87, which responds to composite audio signal for supplying stereophonic signals to the audio source chooser circuitry 55. The controller 57 receives the NTSC/ATSC CONTROL signal from the threshold detector 27 and uses it to determine whether or not an NTSC signal is currently being received. When the controller 57 determines that an NTSC signal is currently being received and that no DTV signal is currently being received, the controller 57 conditions the audio source chooser circuitry 55 to supply the audio amplifiers 65 and 66 stereophonic signals responsive to those from the stereophonic decoder 87.

FIG. 7 shows a video recorder 88 being included in combination with the TV set, forming what is known in the industry as a "combo". FIG. 7 shows the analog stereophonic audio signals from the audio source chooser circuitry 55 and the analog baseband luminance and baseband chrominance signals from the DACs 69, 70 and 71 being supplied to the video recorder 88, there to be digitized again by the video recorder 88 if it is a digital rather than an analog video recorder. The arrangement of video recorder 88 permits recording of NTSC signals as well as DTV signals, which is not possible with a digital video tape recorder arranged to record packets of digital television information before decoding by the MPEG-2 video decoder 50 and the digital audio decoder 52. There are, of course, embodiments of the invention in which the elements 65–68 and 72–76 are dispensed with.

The embodiments of the invention that have been thusfar described do not use automatic gain control of the RF amplifier in the first detector 2. The RF amplifier is reasonably broadband and has a gain of only 10 dB or so; gain control would be desired primarily in environments where input signal strength is exceptionally great, such as in a reception location very near a broadcast transmitter. Where AGC of the RF amplifier is undertaken, it is suggested that both forward-AGC and reverse-AGC arrangements be provided for the RF amplifier. When the NTSC/ATSC CONTROL signal from the threshold detector 27 indicates an NTSC signal is currently being received, the reverse AGC mechanism should provide no gain reduction, and the forward AGC should be relied on to control the RF amplifier gain. When the NTSC/ATSC CONTROL signal from the threshold detector 27 indicates an NTSC signal is not currently being received, the forward AGC mechanism should provide no gain reduction, and the reverse AGC should be relied on to control the RF amplifier gain.

While the preferred embodiments of the invention use first detectors supplying first IF signals in the 917–923 MHz band and IF amplifier chains each cascading a 44 MHz IF amplifier after a 920 MHz IF amplifier, other embodiments of the invention use first detectors supplying first IF signals in the 41–47 MHz band and IF amplifier chains using 44 MHz IF amplifiers, but no 920 MHz IF amplifiers. Less preferred embodiments of the invention use a 964 MHz local oscillator in place of the 876 MHz local oscillator 5; and 44 MHz filtering is modified to take into account the video carrier being translated to 42.25 MHz and the audio carrier being translated to 46.75 MHz. Channel 81 interference is avoided, but the second harmonic distortion of 46.75 audio carrier occasioned by forward AGC generates an FM carrier at 93.5 MHz, which falls within the FM broadcast band. Reducing the frequency of the low IF band by modifying the local oscillator 5 to generate local oscillations at 958.5 MHz translates the audio carrier to 41.25 MHz and the video carrier to 36.75 MHz. The second harmonic distortion of this 41.25 MHz audio carrier occasioned by forward AGC generates an FM carrier at 82.5 MHz, which falls below the FM broadcast band. Channel 81 interference is still avoided and the local oscillator is placed below the aeronautical navigation frequency band. Radio receivers per FIG. 1 and radio receivers using the modifications shown in FIGS. 4–6, in which receivers selectivity is primarily determined by SAW filtering in the 917–923 MHz high IF band are particularly adaptable to the low IF band being placed lower than 41–47 MHz. Placing the low IF band even lower in frequency facilitates direct digitization of the low IF band in still other embodiments of the invention.

DTV receivers that receive QAM DTV signals used in cablecasting as well as VSB DTV signals used for terrestrial through-the-air broadcasting are described by C. B. Patel and the inventor in U.S. Pat. No. 5,506,636 issued Apr. 9, 1996, entitled "HDTV SIGNAL RECEIVER WITH IMAGINARY- SAMPLE-PRESENCE DETECTOR FOR QAM/VSB MODE SELECTION". Where the SAW filter 3 is of a type having a substantially linear-phase, flat-amplitude response that has −1 dB to −1 dB bandwidth of 6 MHz the response of the IF amplifier 8 can be used to supply input signals to circuitry for synchrodyning QAM DTV signals to baseband, as well as to supply input signals to circuitry 9 for synchrodyning VSB DTV signals to baseband. Where the SAW filter 3 is of a type having a narrower bandwidth, so that FM NTSC sound carrier is trapped, the QAM DTV signals will require a parallel IF amplifier chain of their own and a SAW filter of the type having a substantially linear-phase, flat-amplitude response that has −1 dB to −1 dB bandwidth of 6 MHz for selecting the first detector 2 response as input signal to that separate IF amplifier chain. That separate IF amplifier chain can include a mixer that heterodynes an amplified high-IF-band signal with oscillations from the local oscillator 5 to generate a low-IF-band signal.

In the claims which follow, the word "said" is used whenever reference is made to an antecedent, and the word "the" is used for grammatical purposes other than to refer back to an antecedent.

What is claimed is:

1. A radio receiver for selectively receiving one of a plurality of television signals in respective allocated transmission channels each of a prescribed bandwidth, some of which television signals are digital television signals, said radio receiver comprising:

a first detector which generates a first detector response to any television signal in one of said allocated transmission channels selected to be received, said first detector being of a type that translates the frequencies of the selected transmission channel to a range of intermediate frequencies of said prescribed bandwidth, which range of intermediate frequencies is above baseband and is substantially the same whether or not said any television signal in said selected transmission channel is a digital television signal;

first and second intermediate-frequency amplifier chains, each receptive of said first detector response as an input signal, said first intermediate-frequency amplifier chain supplying an amplified first final intermediate-frequency signal, and said second intermediate-frequency amplifier chain supplying an amplified second final intermediate-frequency signal, each of said first and second intermediate-frequency amplifier chains having a respective initial portion which has its gain controlled and having a respective final portion which also has its gain controlled, said initial portions of said first and second intermediate-frequency amplifier chains each having an input port connected for receiving said first detector response and having a respective output port, said final portion of said first intermediate-frequency amplifier chain having an output port connected to said symbol decoder and having an input port, said final portion of said second intermediate-frequency amplifier chain having an output port connected to said video detector and having an input port;

a local oscillator for supplying local oscillations at a frequency offset from the frequencies within the frequency range of said first detector response;

a first mixer having a first input port to which the output port of said initial portion of said first intermediate-frequency amplifier chain is connected, having a second input port connected for receiving said local oscillations from said local oscillator; and having an output port connected for supplying a first mixer output signal to the input port of said final portion of said first intermediate-frequency amplifier chain;

a second mixer having a first input port to which the output port of said initial portion of said second intermediate-frequency amplifier chain is connected, having a second input port connected for receiving said local oscillations from said local oscillator; and having an output port connected for supplying a second mixer output signal to the input port of said final portion of said second intermediate-frequency amplifier chain;

synchrodyning circuitry for generating a baseband signal responsive to said amplified first final intermediate-frequency signal;

a symbol decoder responsive to said baseband signal for supplying data in serial-bit form when said selected one of said television signals is a digital television signal; and a video detector responsive to said amplified second final intermediate-frequency signal for supplying a composite video signal when said selected one of said television signals is an analog television signal.

2. A radio receiver as set forth in claim 1, wherein said first detector is of a type which generates said first detector response in an ultra-high-frequency intermediate-frequency band above the ultra high frequencies assigned as television broadcasting channels.

3. A radio receiver as set forth in claim 2, wherein said first detector is of a type supplying first detector response nominally in the 917–923 MHz frequency range and said local oscillations have a nominal frequency of 876 MHz.

4. A radio receiver as set forth in claim 1, further comprising:

a first intermediate-frequency passband filter being included in said initial portion of said first intermediate-frequency amplifier chain, being receptive of said first detector response as an input signal, and supplying a first intermediate-frequency passband filter response;

a first intermediate-frequency amplifier being included in said initial portion of said first intermediate-frequency amplifier chain, having gain controlled by a first reverse automatic-gain-control signal, having a respective input port to which said first intermediate-frequency passband filter response is applied, and having a respective output port connected to the first input port of said first mixer;

a second intermediate-frequency passband filter being included in said final portion of said first intermediate-frequency amplifier chain, being receptive of said first mixer response as an input signal, and supplying a second intermediate-frequency passband filter response;

a second intermediate-frequency amplifier being included in said final portion of said first intermediate-frequency amplifier chain, having gain controlled by a second reverse automatic-gain-control signal, having a respective input port to which said second intermediate-frequency passband filter response is applied, and having a respective output port for supplying said amplified first final intermediate-frequency signal; and first automatic gain control circuitry for generating said first reverse automatic-gain-control signal and said second reverse automatic-gain-control signal in accordance with the amplitude of a portion of said baseband signal generated by said synchrodyning circuitry.

5. A radio receiver as set forth in claim 4, further comprising: an equalizer for supplying said symbol decoder an equalized response to said digital baseband signal.

6. A radio receiver as set forth in claim 4, further comprising:

a third intermediate-frequency passband filter being included in said initial portion of said second intermediate-frequency amplifier chain, being receptive of said first detector response as an input signal, and supplying a third intermediate-frequency passband filter response;

a third intermediate-frequency amplifier being included in said initial portion of said second intermediate-frequency amplifier chain, having gain controlled by a forward automatic-gain-control signal, having a respective input port to which said third intermediate-frequency passband filter response is applied, and having a respective output port connected to the first input port of said second mixer;

a fourth intermediate-frequency passband filter being included in said final portion of said second intermediate-frequency amplifier chain, being receptive of said second mixer response as an input signal, and supplying a fourth intermediate-frequency passband filter response;

a fourth intermediate-frequency amplifier being included in said final portion of said second intermediate-frequency amplifier chain, having gain controlled by a further automatic-gain-control signal, having a respective input port to which said fourth intermediate-frequency passband filter response is applied, and having a respective output port for supplying said amplified second final intermediate-frequency signal;

frequency-selective filter circuitry for separating said amplified second final intermediate-frequency signal into first and second responses of respective frequency ranges into which video carrier modulation and audio carrier modulation respectively fall when said selected one of said television signals is an analog television signal, said first response of said frequency-selective filter circuitry being applied to said video detector as an input signal therefor; and second automatic gain control circuitry for generating said forward automatic-gain-control signal and said further automatic-gain-control signal in accordance with the amplitude of synchronizing pulse portions of said composite video signal.

7. A radio receiver as set forth in claim 6, further comprising:

a first narrowband bandpass filter for supplying first narrowband bandpass filter response to video carrier in said amplified first final intermediate-frequency signal when said selected one of said television signals is an analog television signal;

a third mixer for receiving said first narrowband bandpass filter response and said second response of said frequency-selective filter circuitry as respective input signals thereto and developing a third mixer output signal therefrom, which is an intercarrier sound intermediate-frequency signal when said selected one of said television signals is an analog television signal;

a sound intermediate-frequency amplifier for amplifying said third mixer output signal to supply an amplified third mixer output signal which is an amplified intercarrier sound intermediate-frequency signal when said selected one of said television signals is an analog television signal, and a frequency-modulation detector responsive to said amplified intercarrier sound intermediate-frequency signal for supplying a composite sound signal at baseband.

8. A radio receiver as set forth in claim 7, further comprising:

a second narrowband bandpass filter for supplying second narrowband bandpass filter response to pilot carrier in said amplified first final intermediate-frequency signal when said selected one of said television signals is a digital television signal;

a first automatic fine tuning detector responsive to said first narrowband bandpass filter response for supplying a first automatic fine tuning detector response when said selected one of said television signals is an analog television signal;

a second automatic fine tuning detector responsive to said second narrowband bandpass filter response for supplying a second automatic fine tuning detector response when said selected one of said television signals is a digital television signal; and a selector for applying said first automatic fine tuning detector response to said first detector when said selected one of said television signals is determined to be an analog television signal and for applying said second automatic fine tuning detector response to said first detector when said selected one of said television signals is determined to be a digital television signal.

9. A radio receiver as set forth in claim 8, further comprising:

an amplitude detector for detecting the amplitude of said amplified intercarrier sound intermediate-frequency signal to generate an amplitude detector output signal; and a threshold detector for determining said selected one of said television signals to be an analog television signal when said amplitude detector output signal exceeds a predetermined threshold value and determining said selected one of said television signals to be a digital television signal when said amplitude detector output signal does not exceed said predetermined threshold value.

10. A radio receiver as set forth in claim 4, further comprising:

a sound trap filter being included in said initial portion of said second intermediate-frequency amplifier chain and supplying a third intermediate-frequency signal in response to said first detector response;

a third intermediate-frequency amplifier being included in said initial portion of said second intermediate-frequency amplifier chain, having gain controlled by a forward automatic-gain-control signal, having a respective input port to which said third intermediate-frequency signal is applied, and having a respective output port connected to the first input port of said second mixer;

a fourth intermediate-frequency amplifier being included in said final portion of said second intermediate-frequency amplifier chain, having gain controlled by a further automatic-gain-control signal, having a respective input port to which said second mixer response is applied, and having a respective output port for supplying said amplified second final intermediate-frequency signal;

frequency-selective filter circuitry for separating said amplified second final intermediate-frequency signal into first and second responses of respective frequency ranges into which video carrier modulation and audio carrier modulation respectively fall when said selected one of said television signals is an analog television signal, said first response of said frequency-selective filter circuitry being applied to said video detector as an input signal therefor;

second automatic gain control circuitry for generating said forward automatic-gain-control signal and said further automatic-gain-control signal in accordance with the amplitude of synchronizing pulse portions of said composite video signal;

a first narrowband bandpass filter for supplying first narrowband bandpass filter response to video carrier in said amplified first final intermediate-frequency signal when said selected one of said television signals is an analog television signal;

a third mixer for receiving said first narrowband bandpass filter response and said second response of said frequency-selective filter circuitry as respective input signals thereto and developing a third mixer output signal therefrom, which is an intercarrier sound intermediate-frequency signal when said selected one of said television signals is an analog television signal;

a sound intermediate-frequency amplifier for amplifying said third mixer output signal to supply an amplified third mixer output signal which is an amplified intercarrier sound intermediate-frequency signal when said selected one of said television signals is an analog television signal, and a frequency-modulation detector responsive to said amplified intercarrier sound intermediate-frequency signal for supplying a composite sound signal at baseband.

11. A radio receiver as set forth in claim 10, wherein said frequency-selective filter circuitry for separating said amplified second final intermediate-frequency signal into first and second responses essentially consists of:

a first surface-acoustic wave filter for supplying said first response to said amplified second fin*1 intermediate-frequency signal, a buffer amplifier for supplying said first surface-acoustic wave filter with said amplified second final intermediate-frequency signal, a second surface-acoustic wave filter for supplying said second response to said amplified second final intermediate-frequency signal, and a buffer amplifier for supplying said second surface-acoustic wave filter with said amplified second final intermediate-frequency signal.

12. A radio receiver as set forth in claim 10, further comprising:

a second narrowband bandpass filter for supplying second narrowband bandpass filter response to pilot carrier in said amplified first final intermediate-frequency signal when said selected one of said television signals is a digital television signal;

a first automatic fine tuning detector responsive to said first narrowband bandpass filter response for supplying a first automatic fine tuning detector response when said selected one of said television signals is an analog television signal;

a second automatic fine tuning detector responsive to said second narrowband bandpass filter response for supplying a second automatic fine tuning detector response when said selected one of said television signals is a digital television signal; and a selector for applying said first automatic fine tuning detector response to said first detector when said selected one of said television signals is determined to be an analog television signal and for applying said second automatic fine tuning detector response to said first detector when said selected one of said television signals is determined to be a digital television signal.

13. A radio receiver as set forth in claim 12, further comprising:

an amplitude detector for detecting the amplitude of said amplified intercarrier sound intermediate-frequency signal to generate an amplitude detector output signal; and a threshold detector for determining said selected one of said television signals to be an analog television signal when said amplitude detector output signal exceeds a predetermined threshold value and determining said selected one of said television signals to be a digital television signal when said amplitude detector output signal does not exceed said predetermined threshold value.

14. A radio receiver as set forth in claim 4, further comprising:

a sound trap filter being included in said initial portion of said second intermediate-frequency amplifier chain and supplying a third intermediate-frequency signal in response to said first detector response;

a third intermediate-frequency amplifier being included in said initial portion of said second intermediate-frequency amplifier chain, having gain controlled by a forward automatic-gain-control signal, having a respective input port to which said third intermediate-frequency signal is applied, and having a respective output port connected to the first input port of said second mixer;

a first surface-acoustic-wave filter being included in said final portion of said second intermediate-frequency amplifier chain for supplying a response to video carrier modulation portions of said second mixer output signal when said selected one of said television signals is an analog television signal;

a fourth intermediate-frequency amplifier being included in said final portion of said second intermediate-frequency amplifier chain, having gain controlled by a further automatic-gain-control signal, having a respective input port to which said response of said first surface-acoustic-wave filter is applied, and having a respective output port for supplying said amplified second final intermediate-frequency signal as input signal to said video detector;

second automatic gain control circuitry for generating said forward automatic-gain-control signal and said further automatic-gain-control signal in accordance with the amplitude of synchronizing pulse portions of said composite video signal;

a second surface-acoustic-wave filter for supplying a response to audio carrier modulation portions of said second mixer output signal when said selected one of said television signals is an analog television signal;

a fifth intermediate-frequency amplifier having gain controlled by said further automatic-gain-control signal, having a respective input port to which said response of said second surface-acoustic-wave filter is applied, and having a respective output port for supplying amplified second surface-acoustic-wave filter response;

a first narrowband bandpass filter for supplying first narrowband bandpass filter response to video carrier in said amplified first final intermediate-frequency signal when said selected one of said television signals is an analog television signal;

a third mixer for receiving said first narrowband bandpass filter response and said amplified second surface-acoustic-wave filter response as respective input signals thereto and developing a third mixer output signal therefrom, which is an intercarrier sound intermediate-frequency signal when said selected one of said television signals is an analog television signal;

a sound intermediate-frequency amplifier for amplifying said third mixer output signal to supply an amplified third mixer output signal which is an amplified intercarrier sound intermediate-frequency signal when said selected one of said television signals is an analog television signal, and a frequency-modulation detector responsive to said amplified intercarrier sound intermediate-frequency signal for supplying a composite sound signal at baseband.

15. A radio receiver as set forth in claim 14, further comprising:

a second narrowband bandpass filter for supplying second narrowband bandpass filter response to pilot carrier in said amplified first final intermediate-frequency signal
when said selected one of said television signals is a
digital television signal;
a first automatic fine tuning detector responsive to said
first narrowband bandpass filter response for supplying
a first automatic fine tuning detector response when
said selected one of said television signals is an analog
television signal;
a second automatic fine tuning detector responsive to said
second narrowband bandpass filter response for supplying a second automatic fine tuning detector response
when said selected one of said television signals is a
digital television signal; and
a selector for applying said first automatic fine tuning
detector response to said first detector when said
selected one of said television signals is determined to
be an analog television signal and for applying said
second automatic fine tuning detector response to said
first detector when said selected one of said television
signals is determined to be a digital television signal.

16. A radio receiver as set forth in claim 15, further comprising:
an amplitude detector for detecting the amplitude of said
amplified intercarrier sound intermediate-frequency
signal to generate an amplitude detector output signal;
and
a threshold detector for determining said selected one of
said television signals to be an analog television signal
when said amplitude detector output signal exceeds a
predetermined threshold value and determining said
selected one of said television signals to be a digital
television signal when said amplitude detector output
signal does not exceed said predetermined threshold
value.

17. A radio receiver as set forth in claim 4, further comprising:
a third intermediate-frequency passband filter being
included in said initial portion of said second
intermediate-frequency amplifier chain, being receptive of said first detector response as an input signal,
and supplying a third intermediate-frequency passband
filter response to the amplitude-modulated video carrier
but not the frequency-modulated audio carrier of said
selected one of said television signals if it is an analog
television signal;
a third intermediate-frequency amplifier being included in
said initial portion of said second intermediate-frequency amplifier chain, having gain controlled by a
forward automatic-gain-control signal, having a
respective input port to which said third intermediate-frequency passband filter response is applied, and having a respective output port connected to the first input
port of said second mixer;
a fourth intermediate-frequency amplifier being included
in said final portion of said second intermediate-frequency amplifier chain, having gain controlled by a
further automatic-gain-control signal, having a respective input port to which said second mixer output signal
is applied, and having a respective output port for
supplying said amplified second final intermediate-frequency signal to said video detector as an input
signal thereto; and
second automatic gain control circuitry for generating
said forward automatic-gain-control signal and said
further automatic-gain-control signal in accordance
with the amplitude of synchronizing pulse portions of
said composite video signal.

18. A radio receiver as set forth in claim 17, further comprising:
a third intermediate-frequency amplifier chain, having an
initial portion with a respective input port connected for
receiving said first detector response and with a respective output port, and having a final portion with an
output port connected to said symbol decoder for
supplying input signal thereto and with an input port;
a third mixer having a first input port to which the output
port of said initial portion of said third intermediate-frequency amplifier chain is connected, having a second input port connected for receiving said local oscillations from said local oscillator; and having an output
port connected for supplying a third mixer output signal
to the input port of said final portion of said third
intermediate-frequency amplifier chain;
a fourth intermediate-frequency passband filter being
included in said initial portion of said third
intermediate-frequency amplifier chain, being receptive of said first detector response as an input signal,
and supplying a fourth intermediate-frequency passband filter response to the frequency-modulated audio
carrier but not the amplitude-modulated video carrier of
said selected one of said television signals if it is an
analog television signal;
a fifth intermediate-frequency amplifier being included in
said initial portion of said third intermediate-frequency
amplifier chain, having gain controlled by said forward
automatic-gain-control signal, having a respective
input port to which said fourth intermediate-frequency
passband filter response is applied, and having a
respective output port connected to the first input port
of said third mixer;
a sixth intermediate-frequency amplifier being included in
said final portion of said third intermediate-frequency
amplifier chain, having gain controlled by said further
automatic-gain-control signal, having a respective
input port to which said third mixer output signal is
applied, and having a respective output port for supplying amplified third mixer output signal;
a first narrowband bandpass filter for supplying first
narrowband bandpass filter response to video carrier in
said amplified first final intermediate-frequency signal
when said selected one of said television signals is an
analog television signal;
a fourth mixer for receiving said first narrowband bandpass filter response and said amplified third mixer
output signal as respective input signals thereto and
developing a fourth mixer output signal therefrom,
which is an intercarrier sound intermediate-frequency
signal when said selected one of said television signals
is an analog television signal;
a sound intermediate-frequency amplifier for amplifying
said fourth mixer output signal to supply an amplified
fourth mixer output signal which is an amplified intercarrier sound intermediate-frequency signal when said
selected one of said television signals is an analog
television signal, and
a frequency-modulation detector responsive to said
amplified intercarrier sound intermediate-frequency
signal for supplying a composite sound signal at baseband.

19. A radio receiver as set forth in claim 18, further comprising:
a second narrowband bandpass filter for supplying second
narrowband bandpass filter response to pilot carrier in said amplified first final intermediate-frequency signal when said selected one of said television signals is a digital television signal;

a first automatic fine tuning detector responsive to said first narrowband bandpass filter response for supplying a first automatic fine tuning detector response when said selected one of said television signals is an analog television signal;

a second automatic fine tuning detector responsive to said second narrowband bandpass filter response for supplying a second automatic fine tuning detector response when said selected one of said television signals is a digital television signal; and a selector for applying said first automatic fine tuning detector response to said first detector when said selected one of said television signals is determined to be an analog television signal and for applying said second automatic fine tuning detector response to said first detector when said selected one of said television signals is determined to be a digital television signal.

20. A radio receiver as set forth in claim 19, further comprising:

an amplitude detector for detecting the amplitude of said amplified intercarrier sound intermediate-frequency signal to generate an amplitude detector output signal; and a threshold detector for determining said selected one of said television signals to be an analog television signal when said amplitude detector output signal exceeds a predetermined threshold value and determining said selected one of said television signals to be a digital television signal when said amplitude detector output signal does not exceed said predetermined threshold value.

21. A radio receiver as set forth in claim 17, further comprising:

a third intermediate-frequency amplifier chain, having an initial portion with a respective input port connected for receiving said first detector response and with a respective output port, and having a final portion with an output port connected to said symbol decoder for supplying input signal thereto and with an input port;

a third mixer having a first input port to which the output port of said initial portion of said third intermediate-frequency amplifier chain is connected, having a second input port connected for receiving said local oscillations from said local oscillator; and having an output port connected for supplying a third mixer output signal to the input port of said final portion of said third intermediate-frequency amplifier chain;

a fourth intermediate-frequency passband filter being included in said initial portion of said third intermediate-frequency amplifier chain, being receptive of said first detector response as an input signal, and supplying a fourth intermediate-frequency passband filter response to the frequency-modulated audio carrier and to the amplitude-modulated video carrier of said selected one of said television signals if it is an analog television signal;

a fifth intermediate-frequency amplifier being included in said initial portion of said third intermediate-frequency amplifier chain, having gain controlled by said forward automatic-gain-control signal, having a respective input port to which said fourth intermediate-frequency passband filter response is applied, and having a respective output port connected to the first input port of said third mixer;

a sixth intermediate-frequency amplifier being included in said final portion of said third intermediate-frequency amplifier chain, having gain controlled by said further automatic-gain-control signal, having a respective input port to which said third mixer output signal is applied, and having a respective output port for supplying amplified third mixer output signal;

a sound detector for generating an intercarrier sound intermediate-frequency signal in response to said amplified third mixer output signal when said selected one of said television signals is an analog television signal;

a sound intermediate-frequency amplifier for amplifying intercarrier sound intermediate-frequency signal to supply an amplified intercarrier sound intermediate-frequency signal when said selected one of said television signals is an analog television signal, and a frequency-modulation detector responsive to said amplified intercarrier sound intermediate-frequency signal for supplying a composite sound signal at baseband.

22. A radio receiver as set forth in claim 21, further comprising:

a first narrowband bandpass filter for supplying first narrowband bandpass filter response to video carrier in said amplified first final intermediate-frequency signal when said selected one of said television signals is an analog television signal;

a second narrowband bandpass filter for supplying second narrowband bandpass filter response to pilot carrier in said amplified first final intermediate-frequency signal when said selected one of said television signals is a digital television signal;

a first automatic fine tuning detector responsive to said first narrowband bandpass filter response for supplying a first automatic fine tuning detector response when said selected one of said television signals is an analog television signal;

a second automatic fine tuning detector responsive to said second narrowband bandpass filter response for supplying a second automatic fine tuning detector response when said selected one of said television signals is a digital television signal; and a selector for applying said first automatic fine tuning detector response to said first detector when said selected one of said television signals is determined to be an analog television signal and for applying said second automatic fine tuning detector response to said first detector when said selected one of said television signals is determined to be a digital television signal.

23. A radio receiver as set forth in claim 22, further comprising:

an amplitude detector for detecting the amplitude of said amplified intercarrier sound intermediate-frequency signal to generate an amplitude detector output signal; and a threshold detector for determining said selected one of said television signals to be an analog television signal when said amplitude detector output signal exceeds a predetermined threshold value and determining said selected one of said television signals to be a digital television signal when said amplitude detector output signal does not exceed said predetermined threshold value.

24. A radio receiver as set forth in claim 17, further comprising:
- a third intermediate-frequency amplifier chain, having a respective input port connected for receiving said first detector response, having a respective output port, and being gain controlled by a still further gain control signal from said second automatic gain control circuitry;
- a fourth intermediate-frequency passband filter being included in said third intermediate-frequency amplifier chain for causing at said output port thereof a response to the frequency-modulated audio carrier and to the amplitude-modulated video carrier of said selected one of said television signals if it is an analog television signal;
- a sound detector for generating an intercarrier sound intermediate-frequency signal from said response to the frequency-modulated audio carrier and to the amplitude-modulated video carrier of said selected one of said television signals if it is an analog television signal;
- a sound intermediate-frequency amplifier for amplifying intercarrier sound intermediate-frequency signal to supply an amplified intercarrier sound intermediate-frequency signal when said selected one of said television signals is an analog television signal, and
- a frequency-modulation detector responsive to said amplified intercarrier sound intermediate-frequency signal for supplying a composite sound signal at baseband.

25. A radio receiver as set forth in claim 24, further comprising:
- a first narrowband bandpass filter for supplying first narrowband and bandpass filter response to video carrier in said amplified first final intermediate-frequency signal when said selected one of said television signals is an analog television signal;
- a second narrowband bandpass filter for supplying second narrowband bandpass filter response to pilot carrier in said amplified first final intermediate-frequency signal when said selected one of said television signals is a digital television signal;
- a first automatic fine tuning detector responsive to said first narrowband bandpass filter response for supplying a first automatic fine tuning detector response when said selected one of said television signals is an analog television signal;
- a second automatic fine tuning detector responsive to said second narrowband bandpass filter response for supplying a second automatic fine tuning detector response when said selected one of said television signals is a digital television signal; and
- a selector for applying said first automatic fine tuning detector response to said first detector when said selected one of said television signals is determined to be an analog television signal and for applying said second automatic fine tuning detector response to said first detector when said selected one of said television signals is determined to be a digital television signal.

26. A radio receiver as set forth in claim 25, further comprising:
- an amplitude detector for detecting the amplitude of said amplified intercarrier sound intermediate-frequency signal to generate an amplitude detector output signal; and
- a threshold detector for determining said selected one of said television signals to be an analog television signal when said amplitude detector output signal exceeds a predetermined threshold value and determining said selected one of said television signals to be a digital television signal when said amplitude detector output signal does not exceed said predetermined threshold value.

* * * * *